United States Patent
Dierichs et al.

(10) Patent No.: US 7,746,445 B2
(45) Date of Patent: Jun. 29, 2010

(54) LITHOGRAPHIC APPARATUS, DEVICE MANUFACTURING METHOD AND A SUBSTRATE

(75) Inventors: Marcel Mathijs Theodore Marie Dierichs, Venlo (NL); Johannes Catharinus Hubertus Mulkens, Waalre (NL); Bob Streefkerk, Tilburg (NL)

(73) Assignee: ASML Netherlands B.V., Veldhoven (NL)

( * ) Notice: Subject to any disclaimer, the term of this patent is extended or adjusted under 35 U.S.C. 154(b) by 594 days.

(21) Appl. No.: 11/642,912

(22) Filed: Dec. 21, 2006

(65) Prior Publication Data
US 2007/0103655 A1  May 10, 2007

Related U.S. Application Data

(63) Continuation of application No. 10/898,674, filed on Jul. 26, 2004, now Pat. No. 7,175,968, which is a continuation-in-part of application No. 10/775,326, filed on Feb. 11, 2004, now Pat. No. 7,326,522.

(30) Foreign Application Priority Data

Jul. 28, 2003 (EP) .................................. 03254723

(51) Int. Cl.
*G03B 27/52* (2006.01)
*G03B 27/42* (2006.01)

(52) U.S. Cl. .......................................... 355/30; 355/53

(58) Field of Classification Search .................. 355/27, 355/30, 53, 55, 72, 75; 359/886, 665, 642; 216/83
See application file for complete search history.

(56) References Cited

U.S. PATENT DOCUMENTS

| | | | |
|---|---|---|---|
| 3,573,975 A | 4/1971 | Dhaka et al. | 117/212 |
| 3,648,587 A | 3/1972 | Stevens | 95/44 |
| 4,346,164 A | 8/1982 | Tabarelli et al. | 430/311 |
| 4,390,273 A | 6/1983 | Loebach et al. | 355/125 |
| 4,396,705 A | 8/1983 | Akeyama et al. | 430/326 |
| 4,480,910 A | 11/1984 | Takanashi et al. | 355/30 |
| 4,509,852 A | 4/1985 | Tabarelli et al. | 355/30 |

(Continued)

FOREIGN PATENT DOCUMENTS

DE         206 607         2/1984

(Continued)

OTHER PUBLICATIONS

Information Disclosure Statement filed Aug. 11, 2006 for U.S. Appl. No. 11/502,414.

(Continued)

*Primary Examiner*—Peter B Kim
(74) *Attorney, Agent, or Firm*—Pillsbury Winthrop Shaw Pittman, LLP

(57) ABSTRACT

A substrate is provided with a coating of material which is substantially transparent to the wavelength of the projection beam. The coating may be thicker than the wavelength of the projection beam and have a refractive index of the coating such that the wavelength of the projection beam is shortened as it passes through it. This allows the imaging of smaller features on the substrate. Alternatively, the coating may be used with a liquid supply system and act to keep bubbles away from a radiation sensitive layer of the substrate.

28 Claims, 4 Drawing Sheets

U.S. PATENT DOCUMENTS

| | | | |
|---|---|---|---|
| 5,040,020 A | 8/1991 | Rauschenbach et al. | 355/53 |
| 5,121,256 A | 6/1992 | Corle et al. | 359/664 |
| 5,282,066 A * | 1/1994 | Yu et al. | 359/3 |
| 5,339,128 A | 8/1994 | Tateyama et al. | |
| 5,610,683 A | 3/1997 | Takahashi | 355/53 |
| 5,715,039 A | 2/1998 | Fukuda et al. | 355/53 |
| 5,825,043 A | 10/1998 | Suwa | 250/548 |
| 5,830,623 A | 11/1998 | Maruyama et al. | |
| 5,900,354 A | 5/1999 | Batchelder | 430/395 |
| 5,962,079 A | 10/1999 | Koberstein et al. | |
| 6,191,429 B1 | 2/2001 | Suwa | |
| 6,236,634 B1 | 5/2001 | Lee et al. | 369/112 |
| 6,560,032 B2 | 5/2003 | Hatano | 359/656 |
| 6,600,547 B2 | 7/2003 | Watson et al. | |
| 6,603,130 B1 | 8/2003 | Bisschops et al. | 250/492.1 |
| 6,633,365 B2 | 10/2003 | Suenaga | 355/53 |
| 6,727,047 B2 | 4/2004 | Montgomery et al. | |
| 6,788,477 B2 | 9/2004 | Lin | |
| 6,939,664 B2 * | 9/2005 | Huang et al. | 430/270.1 |
| 6,954,256 B2 | 10/2005 | Flagello et al. | 355/53 |
| 6,992,750 B2 | 1/2006 | Kawashima et al. | |
| 7,175,968 B2 | 2/2007 | Dierichs et al. | |
| 2002/0020821 A1 | 2/2002 | Van Santen et al. | 250/492 |
| 2002/0076626 A1 | 6/2002 | Montgomery et al. | |
| 2002/0163629 A1 | 11/2002 | Switkes et al. | 355/53 |
| 2003/0030916 A1 | 2/2003 | Suenaga | |
| 2003/0123040 A1 | 7/2003 | Almogy | 355/69 |
| 2003/0174408 A1 | 9/2003 | Rostalski et al. | 359/642 |
| 2004/0000627 A1 | 1/2004 | Schuster | |
| 2004/0021844 A1 | 2/2004 | Suenaga | |
| 2004/0075895 A1 | 4/2004 | Lin | 359/380 |
| 2004/0109237 A1 | 6/2004 | Epple et al. | |
| 2004/0118184 A1 | 6/2004 | Violette | |
| 2004/0119954 A1 | 6/2004 | Kawashima et al. | 355/30 |
| 2004/0125351 A1 | 7/2004 | Krautschik | 355/53 |
| 2004/0136494 A1 | 7/2004 | Lof et al. | |
| 2004/0169834 A1 | 9/2004 | Richter et al. | |
| 2004/0169924 A1 | 9/2004 | Flagello et al. | |
| 2004/0180294 A1 | 9/2004 | Baba-Ali et al. | |
| 2004/0180299 A1 | 9/2004 | Rolland et al. | |
| 2004/0224265 A1 | 11/2004 | Endo et al. | |
| 2004/0224525 A1 | 11/2004 | Endo et al. | |
| 2004/0227923 A1 | 11/2004 | Flagello et al. | |
| 2004/0253547 A1 | 12/2004 | Endo et al. | |
| 2004/0253548 A1 | 12/2004 | Endo et al. | |
| 2004/0257544 A1 | 12/2004 | Vogel et al. | |
| 2004/0259008 A1 | 12/2004 | Endo et al. | |
| 2004/0259040 A1 | 12/2004 | Endo et al. | |
| 2004/0263808 A1 | 12/2004 | Sewell | |
| 2005/0002004 A1 | 1/2005 | Kolesnychenko et al. | |
| 2005/0024609 A1 | 2/2005 | De Smit et al. | |
| 2005/0030506 A1 | 2/2005 | Schuster | |
| 2005/0036121 A1 | 2/2005 | Hoogendam et al. | |
| 2005/0036183 A1 | 2/2005 | Yeo et al. | |
| 2005/0036184 A1 | 2/2005 | Yeo et al. | |
| 2005/0036213 A1 | 2/2005 | Mann et al. | |
| 2005/0037269 A1 | 2/2005 | Levinson | |
| 2005/0046934 A1 | 3/2005 | Ho et al. | |
| 2005/0048223 A1 | 3/2005 | Pawloski et al. | |
| 2005/0068639 A1 | 3/2005 | Pierrat et al. | |
| 2005/0073670 A1 | 4/2005 | Carroll | |
| 2005/0084794 A1 | 4/2005 | Meagley et al. | |
| 2005/0100745 A1 | 5/2005 | Lin et al. | |
| 2005/0117224 A1 | 6/2005 | Shafer et al. | |
| 2005/0122497 A1 | 6/2005 | Lyons et al. | |
| 2005/0123863 A1 | 6/2005 | Chang et al. | |
| 2005/0130079 A1 | 6/2005 | Endo et al. | |
| 2005/0141098 A1 | 6/2005 | Schuster | |
| 2005/0147920 A1 | 7/2005 | Lin et al. | |
| 2005/0175776 A1 | 8/2005 | Streefkerk et al. | |
| 2005/0175940 A1 | 8/2005 | Dierichs | |
| 2005/0190455 A1 | 9/2005 | Rostalski et al. | |
| 2005/0217135 A1 | 10/2005 | O'Donnell et al. | |
| 2005/0217137 A1 | 10/2005 | Smith et al. | |
| 2005/0217703 A1 | 10/2005 | O'Donnell | |
| 2005/0225734 A1 | 10/2005 | De Smit et al. | |
| 2005/0225738 A1 | 10/2005 | Shirai | |
| 2006/0141400 A1 | 6/2006 | Hirayama et al. | |
| 2006/0274294 A1 | 12/2006 | Nagasaka et al. | |
| 2007/0031755 A1 * | 2/2007 | Hirayama et al. | 430/270.1 |
| 2007/0103655 A1 | 5/2007 | Dierichs et al. | |

FOREIGN PATENT DOCUMENTS

| | | |
|---|---|---|
| DE | 221 563 | 4/1985 |
| DE | 224448 | 7/1985 |
| DE | 242880 | 2/1987 |
| EP | 0023231 | 2/1981 |
| EP | 0418427 | 3/1991 |
| EP | 0 605 103 A1 | 7/1994 |
| EP | 0 834 773 A2 | 4/1998 |
| EP | 1039511 | 9/2000 |
| EP | 1 477 856 A1 | 11/2004 |
| EP | 1 491 956 A1 | 12/2004 |
| FR | 2474708 | 7/1981 |
| JP | A 57-153433 | 9/1982 |
| JP | 58-202448 | 11/1983 |
| JP | A 59-19912 | 2/1984 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | A 05-62877 | 3/1993 |
| JP | 06-124873 | 5/1994 |
| JP | A 6-168866 | 6/1994 |
| JP | A 5-304072 | 11/1994 |
| JP | 07-132262 | 5/1995 |
| JP | 07-220990 | 8/1995 |
| JP | 08-316125 | 11/1996 |
| JP | 09-139343 | 5/1997 |
| JP | 09-139433 A | 5/1997 |
| JP | A 10-154659 | 6/1998 |
| JP | 10-228661 | 8/1998 |
| JP | 10-255319 | 9/1998 |
| JP | 10-303114 | 11/1998 |
| JP | 10-340846 | 12/1998 |
| JP | 11-038634 | 2/1999 |
| JP | 11-176727 | 7/1999 |
| JP | 11-260686 | 9/1999 |
| JP | 2000-058436 | 2/2000 |
| JP | 2001-091849 | 4/2001 |
| JP | 2003-121634 | 4/2003 |
| JP | 2004-193252 | 7/2004 |
| JP | 2005-510761 | 4/2005 |
| JP | 2006-227632 A | 8/2006 |
| WO | WO 99/49504 | 9/1999 |
| WO | WO 02/091078 A1 | 11/2002 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |

| | | |
|---|---|---|
| WO | WO 2004/057590 A1 | 7/2004 |
| WO | WO 2004/077154 A1 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/054953 A2 | 6/2005 |
| WO | WO 2005/054955 A2 | 6/2005 |
| WO | WO 2005/062128 A2 | 7/2005 |

OTHER PUBLICATIONS

Office Action dated Jan. 6, 2006 issued for U.S. Appl. No. 10/898,674.
Office Action dated May 1, 2006 issued for U.S. Appl. No. 10/898,674.
Office Action dated Aug. 17, 2006 issued for U.S. Appl. No. 10/898,674.
U.S. Appl. No. 10/773,461, filed Feb. 9, 2004, Duineveld et al.
U.S. Appl. No. 10/698,012, filed Oct. 31, 2003, Flagello et al.
U.S. Appl. No. 10/705,804, filed Nov. 12, 2003, De Smit et al.
U.S. Appl. No. 10,705,805, filed Nov. 12, 2003, Lof et al.
U.S. Appl. No. 10/705,783, filed Nov. 12, 2003, Lof et al.
U.S. Appl. No. 10,743,271, filed Dec. 23, 2003, Van Santen et al.
U.S. Appl. No. 10/743,266, filed Dec. 23, 2003, Mulkens et al.
U.S. Appl. No. 10/705,785, filed Nov. 12, 2003, Derksen et al.
U.S. Appl. No. 10/724,402, filed Dec. 1, 2003, Simon et al.
U.S. Appl. No. 10/715,116, filed Nov. 18, 2003, Bleeker.
U.S. Appl. No. 10/719,683, filed Nov. 24, 2003, Streefkerk et al.
U.S. Appl. No. 10/705,816, filed Nov. 12, 2003, Lof et al.
U.S. Appl. No. 10/775,326, filed Feb. 11, 2004, Dierichs.
U.S. Appl. No. 10/367,910, filed Feb. 19, 2003, Suwa et al.
M. Switkes et al., "Immersion Lithography at 157 nm", MIT Lincoln Lab, Orlando 2001-1, Dec. 17, 2001.
M. Switkes et al., "Immersion Lithography at 157 nm", J. Vac. Sci. Technol. B., vol. 19, No. 6, Nov./Dec. 2001, pp. 2353-2356.
M. Switkes et al., "Immersion Lithography: Optics for the 50 nm Node", 157 Anvers-1, Sep. 4, 2002.
B.J. Lin, "Drivers, Prospects and Challenges for Immersion Lithography", TSMC, Inc., Sep. 2002.
B.J. Lin, "Proximity Printing Through Liquid", IBM Technical No. 11B, Apr. 1978, p. 4997 Disclosure Bulletin, vol. 20, No. 11B, Apr. 1978, p. 4997.
B.J. Lin, "The Paths to Subhalf-Micrometer Optical Lithography", SPIE vol. 922, Optical/Laser Microlithography (1988), pp. 256-269.
G.W.W. Stevens, "Reduction of Waste Resulting from Mask Defects", Solid State Technology, Aug. 1978, vol. 21 008, pp. 68-72.
S. Owa et al., "Immersion Lithography; its potential performance and issues", SPIE Microlithography 2003, 5040-186, Feb. 27, 2003.
S. Owa et al., "Advantage and Feasibility of Immersion Lithography", Proc. SPIE 5040 (2003).
Nikon Precision Europe GmbH, "Investor Relations—Nikon's 2003 Real Solutions", May 15, 2003.
H. Kawata et al., "Optical Projection Lithography using Lenses with Numerical Apertures Greater than Unity", Microelectronic Engineering 9 (1989), pp. 31-36.
J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.
B.W. Smith et al., "Immersion Optical Lithography at 193nm", Future Fab International, vol. 15, Jul. 11, 2003.
H. Kawata et al., "Fabrication of 0.2µm Fine Patterns Using Optical Projection Lithography with an Oil Immersion Lens", Jpn. J. Appl. Phys. vol. 31 (1992), pp. 4174-4177.
G. Owen et al., "1/8µm Optical Lithography", J. Vac. Sci. Technol. B., vol. 10, No. 6, Nov./Dec. 1992, pp. 3032-3036.
H. Hogan, "New Semiconductor Lithography Makes a Splash", Photonics Spectra, Photonics TechnologyWorld, Oct. 2003 Edition, pp. 1-3.
S. Owa and N. Nagasaka, "Potential Performance and Feasibility of Immersion Lithography", NGL Workshop 2003, Jul. 10, 2003, Slide Nos. 1-33.
S. Owa et al., "Update on 193nm immersion exposure tool", Litho Forum, International Sematech, Los Angeles, Jan. 27-29, 2004, Slide Nos. 1-51.
H. Hata, "The Development of Immersion Exposure Tools", Litho Forum, International Sematech, Los Angeles, Jan. 27-29, 2004, Slide Nos. 1-22.
T. Matsuyama et al., "Nikon Projection Lens Update", SPIE Microlithography 2004, 5377-65, Mar., 2004.
"Depth-of-Focus Enhancement Using High Refractive Index Layer on the Imaging Layer",IBM Technical Disclosure Bulletin, vol. 27, No. 11, Apr. 1985, p. 6521.
A. Suzuki, "Lithography Advances on Multiple Fronts", EEdesign, EE Times, Jan. 5, 2004.
B. Lin, The $k_3$ coefficient in nonparaxial λ/NA scaling equations for resolution, depth of focus, and immersion lithography, *J. Microlith., Microfab., Microsys.* 1(1):7-12 (2002).
European Search Report for EP Application No. 03254723.4.

* cited by examiner

LITHOGRAPHIC APPARATUS, DEVICE MANUFACTURING METHOD AND A SUBSTRATE

This application is a continuation application of U.S. patent application Ser. No. 10/898,674, filed Jul. 26, 2004 now U.S. Pat. No. 7,175,968, which is a continuation-in-part of U.S. patent application Ser. No. 10/775,326, filed Feb. 11, 2004 now U.S. Pat. No. 7,329,522, and which claims priority from European Patent Application No. EP 03254723.4, filed Jul. 28, 2003, each of the foregoing applications incorporated herein in their entirety by reference.

FIELD

The present invention relates to a lithographic apparatus, a device manufacturing method and a substrate.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at one time, and so-called scanners, in which each target portion is irradiated by scanning the pattern through the projection beam in a given direction (the "scanning"-direction) while synchronously scanning the substrate parallel or anti-parallel to this direction.

It has been proposed to immerse at least a portion of a substrate in a lithographic projection apparatus in a liquid having a relatively high refractive index, e.g. water, so as to fill a space between an element of the projection system and the substrate. The point of this is to enable imaging of smaller features since the exposure radiation will have a shorter wavelength in the liquid. (The effect of the liquid may also be regarded as increasing the effective NA of the lithographic projection apparatus and also increasing the depth of focus.) Other immersion liquids have been proposed, including water with solid particles (e.g. quartz) suspended therein.

However, submersing a substrate or a substrate and substrate table in a bath of liquid (see for example U.S. Pat. No. 4,509,852, hereby incorporated in its entirety by reference) means that there may be a large body of liquid that must be accelerated during a scanning exposure. This may require additional or more powerful motors and turbulence in the liquid may lead to undesirable and unpredictable effects.

One of the solutions proposed is for a liquid supply system to provide liquid on only a localized area of the substrate and in between a final element of the projection system and the substrate (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

SUMMARY

A difficulty in immersion lithography is the complexity of the arrangement to supply liquid to the space between the final element of the projection system and the substrate as well as the measures that must be taken to ensure that other parts of the apparatus can accommodate the presence of a significant amount of liquid.

Accordingly, it would be advantageous, for example, to reduce the complexity of an immersion lithography apparatus.

According to an aspect, there is provided a lithographic projection apparatus arranged to transfer a pattern to a radiation-sensitive layer of a substrate using a beam of radiation having an exposure wavelength, comprising a coater arranged to at least partially coat the substrate with a layer of non-radiation-sensitive coating material which is at least partially transparent to radiation of the exposure wavelength, wherein the layer of non-radiation-sensitive coating material is positioned before the layer of radiation-sensitive material in the path of the beam of radiation, and wherein the coater applies the layer of non-radiation-sensitive coating material to a thickness which is greater than the exposure wavelength.

When radiation from a projection system passes through the coating its wavelength may be reduced. This allows the imaging of smaller features on the substrate. (It may also be seen as increasing the effective numerical aperture of the system, or increasing the depth of field.) There may be no need to provide a complex liquid supply system, as with previously proposed apparatus because the coating simulates the effect of at least partly filling a space between the surface of the substrate and the final element of the projection lens with a liquid.

In an embodiment, the coater is further arranged to at least partially coat the substrate with a protective material configured to protect the layer of radiation-sensitive material prior to coating the substrate with the non-radiation-sensitive coating material. The protective layer protects the radiation-sensitive material from contaminants present in the environment of the apparatus.

In an embodiment, the coater is further arranged to at least partially cover the non-radiation-sensitive coating material with an evaporation prevention material configured to prevent the coating from evaporating.

According to a further aspect, there is provided a device manufacturing method comprising projecting a patterned beam of radiation having an exposure wavelength onto a target portion of a substrate that is at least partially covered by a layer of radiation-sensitive material, wherein a layer of non-radiation-sensitive coating material which is at least partly transparent to radiation of the exposure wavelength is applied to the target portion, the layer of non-radiation-sensitive coating material being positioned before the layer of radiation-sensitive material in the path of the patterned beam of radiation, and the layer of non-radiation-sensitive coating material having a thickness which is greater than the exposure wavelength.

Thus, it may be possible to reduce the wavelength of the radiation simply by applying a coating to the substrate. The method does not add much complexity to the previously known methods, so it may be implemented cheaply.

In an embodiment, the method further comprises at least partially applying a layer of protective material, configured to protect the layer of radiation-sensitive material, to the substrate prior to applying the layer of non-radiation-sensitive coating material.

In an embodiment, the method further comprises at least partially applying a layer of evaporation prevention material, configured to prevent the non-radiation-sensitive coating material from evaporating, onto the layer of non-radiation-sensitive coating material.

According to a further aspect, there is provided a substrate for use in a lithographic projection apparatus, the substrate being at least partially covered by a layer of radiation sensitive material which is sensitive to a beam of radiation having an exposure wavelength, and the substrate being at least partially coated with a layer of non-radiation-sensitive coating material which is at least partially transparent to radiation of the exposure wavelength and has a thickness which is greater than the exposure wavelength, wherein the layer of non-radiation-sensitive material is positioned before the layer of radiation-sensitive material in the path of the beam of radiation.

In an embodiment, the substrate is further at least partially coated with a layer of protective material configured to protect the layer of radiation-sensitive material, the layer of protective material positioned between the radiation-sensitive material and the non-radiation-sensitive coating material.

In an embodiment, the substrate is further at least partially coated with a layer of evaporation prevention material on the layer of non-radiation-sensitive coating material, the evaporation prevention material configured to prevent the non-radiation sensitive coating material from evaporating In an embodiment, coating material has a refractive index in the range of 1.0 to 1.9. If the refractive index is in this range, the coating will be effective to reduce the wavelength of the beam of radiation passing though it.

In an embodiment, the coating material is substantially water. Water has a refractive index of 1.44 and so is a good material to use as the coating. It also has an advantage that it is not hazardous and can easily be applied and removed as required.

A further difficulty in immersion lithography may be the existence of bubbles and/or particles in the liquid. This is a particular problem during scanning of a substrate with respect to the projection system. In this circumstance it is possible that bubbles and/or particles become attached to the substrate surface. These bubbles and/or particles can disrupt the patterned beam so that the quality of the substrate produced may be reduced.

Accordingly, it would be advantageous, for example, to reduce the effect of bubbles and/or particles in liquid on the quality of the product.

According to an aspect, there is provided a device manufacturing method comprising:

providing a liquid between a projection system of a lithographic projection apparatus and a substrate, the substrate comprising a non-radiation sensitive material being at least partially transparent to radiation, being of a different material than the liquid, and being provided over at a part of a radiation sensitive layer of the substrate; and projecting a patterned beam of radiation, through the liquid, onto a target portion of the substrate using the projection system.

Bubbles on the surface of a substrate in contact with liquid may be kept far away enough from the radiation sensitive material on the substrate so that their effect on the patterned beam is less than if the bubbles were closer to the radiation sensitive material. If the non-radiation sensitive material is made of sufficient thickness, it is possible that bubbles on the interface between the liquid and the non-radiation sensitive material will only introduce stray light and not seriously affect the quality of the imaged substrate. The above may also work on the same principle for particles which are present in the liquid, as well as, or instead of, bubbles.

In an embodiment, the non-radiation sensitive material has a thickness, the radiation has a wavelength and the thickness is greater than the wavelength. In this way, when the radiation from a projection system passes through the non-radiation sensitive material its wavelength may be reduced. This may allow the imaging of smaller features on the substrate.

In an embodiment, the non-radiation sensitive material has a thickness of at least 5 μm. In embodiments, the thickness may be at least 10 μm or at least 20 μm. At these thicknesses, the effects on imaging of the bubbles and/or particles may be dramatically reduced. Also, at these thicknesses it may be possible to provide liquid between a surface of the non-radiation sensitive material and a projection system which is effective to reduce the wavelength of the beam while aiming to reduce the effects of bubbles and/or particles on imaging quality.

In an embodiment, the non-radiation sensitive material has a first refractive index, the liquid has a second refractive index, and the first refractive index is at least as large as the second refractive index. Thus, the effect of the non-radiation sensitive material may be not to increase the wavelength of the beam.

According to a further aspect, there is provided a substrate for use in a lithographic projection apparatus, the substrate being at least partly covered by a radiation sensitive layer, the radiation sensitive layer being at least partly covered with a non-radiation sensitive material which is at least partly transparent to the radiation and being of a different material than a liquid through which a patterned beam of radiation of the lithographic projection apparatus is projected onto a target portion of the substrate.

This substrate may be used in the method(s) described herein.

According to a further aspect, there is provided a device manufacturing method comprising:

providing a liquid, between a projection system of a lithographic projection apparatus and a substrate, to a non-radiation sensitive material on the substrate, the non-radiation sensitive material, which is at least partially transparent to radiation, provided over at least a part of a radiation sensitive layer of the substrate and having a thickness effective to substantially reduce the effect of bubbles in the liquid, particles in the liquid, or both on the quality of a patterned beam impinging on the radiation sensitive layer; and projecting a patterned beam of radiation, through the liquid, onto a target portion of the substrate using the projection system.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
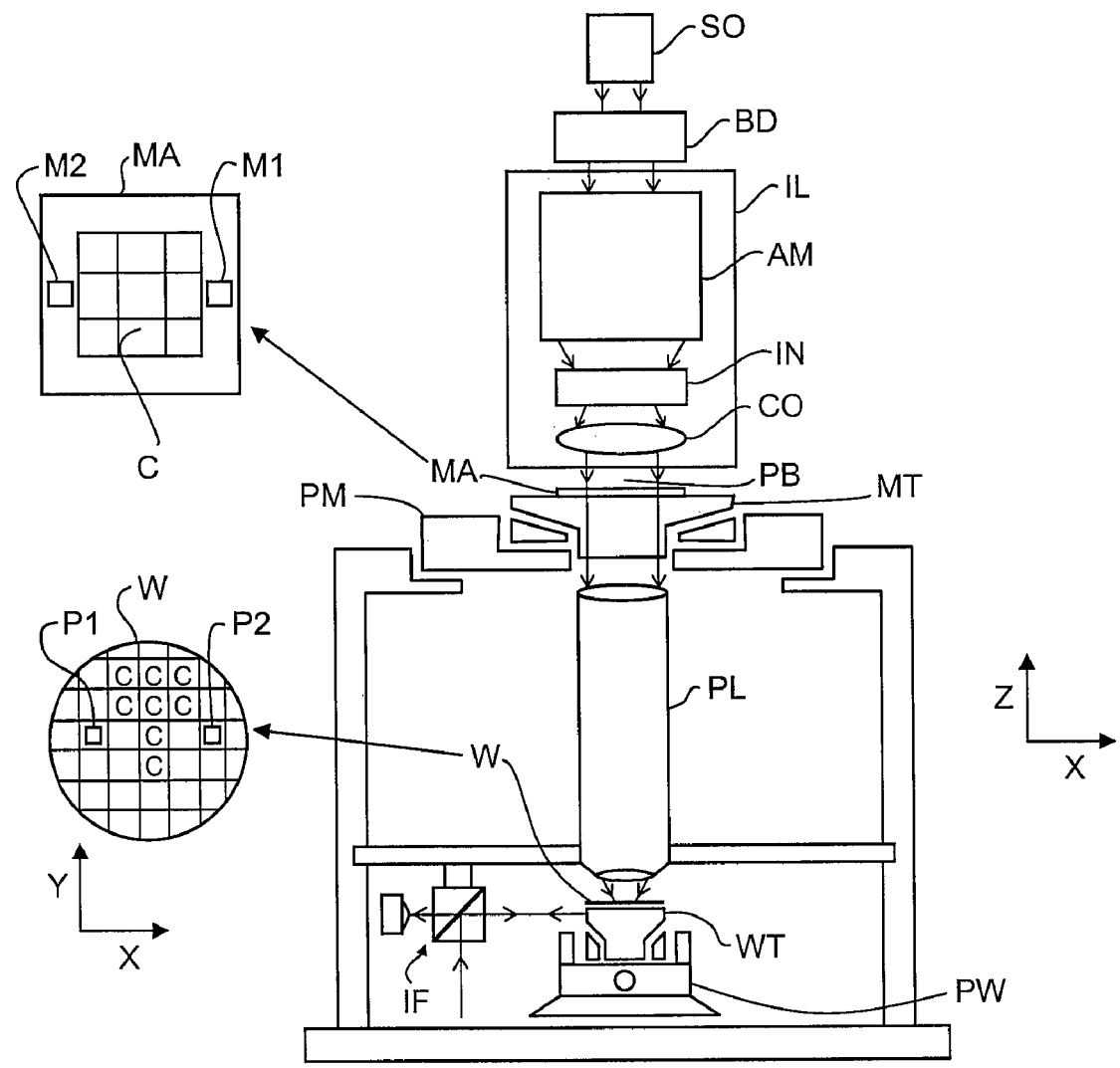
FIG. 1 depicts a lithographic apparatus according to an embodiment of the invention.
Figure 1:
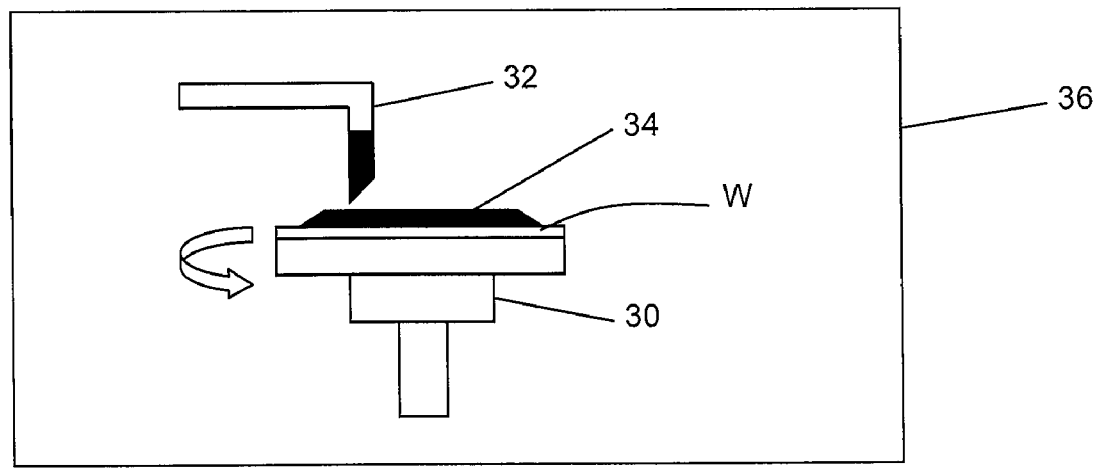
Figure 2:
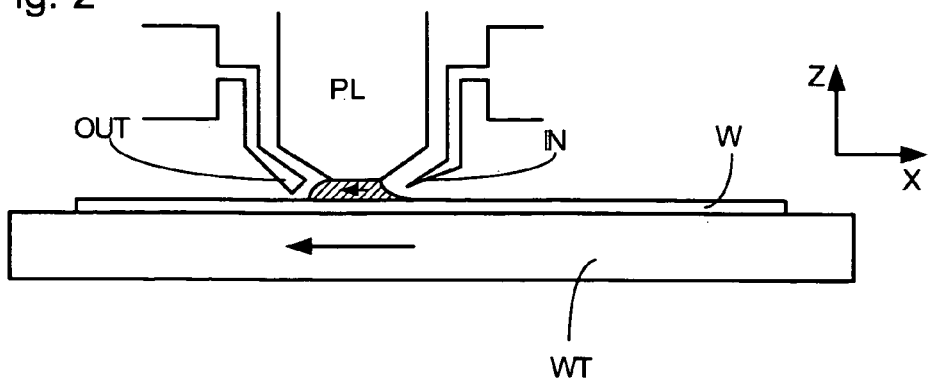
FIG. 2 illustrates, in cross-section, a liquid supply system for use with an embodiment of the invention.
Figure 3:
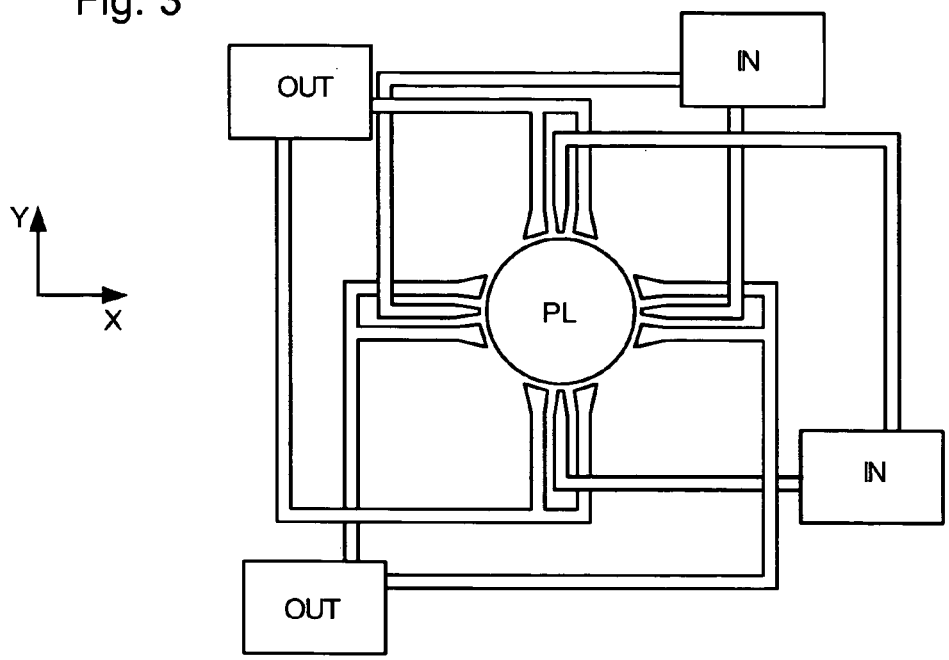
FIG. 3 illustrates the liquid supply system of FIG. 2 in plan.

FIG. 1 schematically depicts a lithographic apparatus according to a particular embodiment of the invention. The apparatus comprises:

- an illumination system (illuminator) IL for providing a projection beam PB of radiation (e.g. UV radiation).
- a first support structure (e.g. a mask table) MT for supporting a patterning device (e.g. a mask) MA and connected to a first positioning device PM for accurately positioning the patterning device with respect to item PL;
- a substrate table (e.g. a wafer table) WT for holding a substrate (e.g. a resist-coated wafer) W and connected to a second positioning device PW for accurately positioning the substrate with respect to item PL; and
- a projection system (e.g. a refractive projection lens system) PL for imaging a pattern imparted to the projection beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise an adjusting device AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following modes:

1. In step mode, the mask table MT and the substrate table WT are kept essentially stationary, while an entire pattern imparted to the projection beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 5:
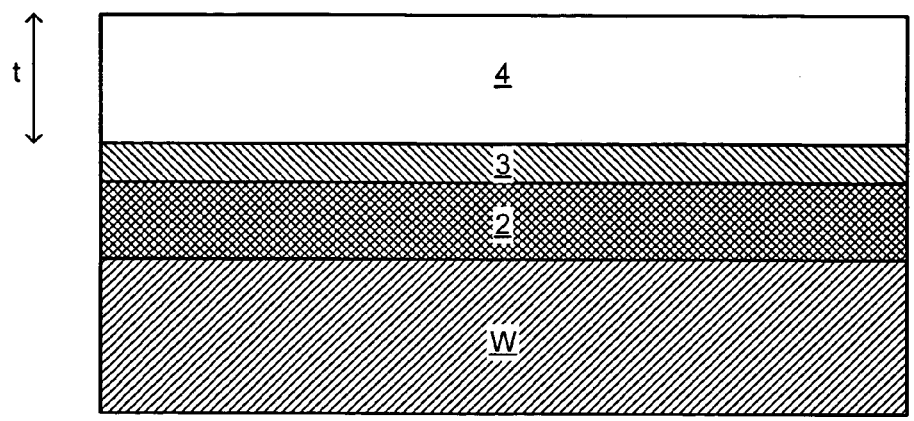
FIG. 5 depicts a substrate with a coating according to a first embodiment of the invention.

FIG. 5 depicts a substrate W ready for processing in the apparatus. A layer of resist 2 is present on top of the surface of the substrate. A layer 3 of protective material is present above the resist to protect it from contaminants. This layer 3 of protective material is thin, less than one wavelength of the radiation of the projection beam. In this embodiment, it is approximately 50 nm thick. A coating 4 (or top coat) is applied by a coating system (described in more detail below) on top of the protective layer 3. This can be done at any time after the protective layer is applied until the substrate enters the projection area of the lithographic apparatus. The coating 4 is non-photosensitive and is at least partially transparent to radiation of the wavelength of the projection beam. In an embodiment, the coating transmits as much or the radiation of the projection beam as possible. The coating 4 can also act as a chemical barrier for environmental contaminants, in that case the protective layer 3 is not needed.

The coating 4 can be liquid or solid, in this embodiment the coating comprises distilled water. Water is easy to apply and remove from the surface of the substrate W and does not pose a chemical hazard. However, other materials are also suitable. Examples of liquids which can be used include liquids suitable for immersing the substrate. Examples of solids which can be used include the base polymer of photoresists that are transparent but not photosensitive, for example acetal systems or polyvinylphenol (PVP).

The coating 4 has a thickness t at least as thick as the wavelength of the beam, but may be thicker if required. This minimum thickness ensures that the coating is effective to reduce the wavelength of the radiation passing through it. Thus the thickness should be, for example, at least 365, 248, 193, 157 or 126 nm depending on the wavelength of the projection beam. It may also be thicker, corresponding to any multiple of a wavelength greater than 1. A limit on the thickness will be imposed by the clearance between the substrate and the final element of the projection system. Thus a maximum thickness of the coating 2 may be 1 mm or greater depending on the construction of the apparatus. For example, when water is used as the coating 4, a thicker coating can be applied to allow for evaporation and ensure that surface tension effects do not cause the coating to gather together into droplets.

When the substrate according to an embodiment of the present invention is used in a lithographic apparatus, the presence of the coating 4 simulates the effect of filling the area between the surface of the substrate and the final element of the projection system with liquid. The beam passes through the coating 4 prior to impinging on the resist 2. When the beam enters the coating 4 its wavelength is reduced. For this effect to occur the refractive index of the coating should be between that of air (1.0) and the resist (approximately 1.7). In an embodiment, the refractive index is around 1.4. Water, with a refractive index of 1.44, is particularly suitable for use as the coating. The protective layer 3 has no effect on the wavelength of the projection beam because its thickness is smaller than the wavelength.

Thus, advantages of immersing the substrate are achieved without a complex liquid supply system. Furthermore, it is possible to apply the one or more embodiments of the invention to an existing apparatus without substantial change in its construction, for example only a minor change to the handling of the substrate may be required.

Figure 6:
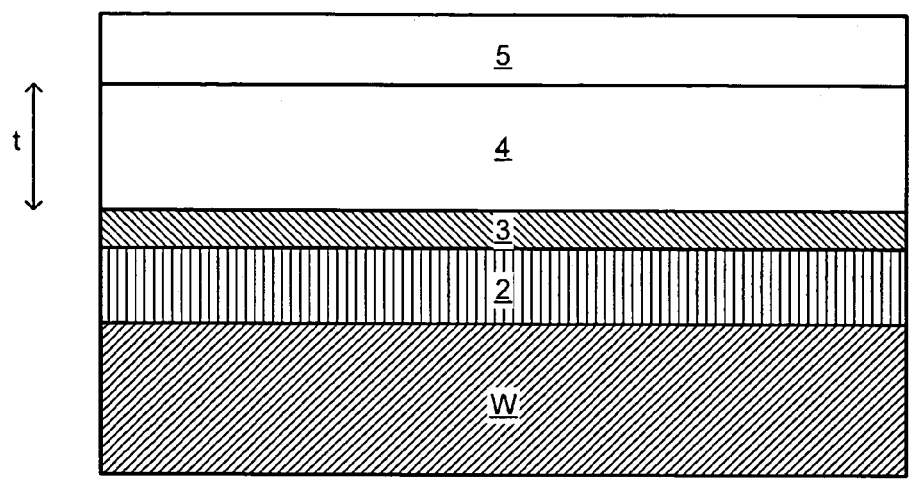
FIG. 6 depicts a substrate with a coating according to a second embodiment of the invention.

A second embodiment of the present invention is depicted in FIG. 6. The construction of this embodiment is the same as for the first embodiment save as described below.

In this embodiment, an evaporation prevention layer 5 is applied on top of the coating 4. This evaporation prevention layer 5 is a liquid, for example an oil, which has a boiling point higher than the boiling point of the coating 4. Thus, evaporation of the coating 4 is prevented by the presence of the layer 5. The layer 5 is at least partially transparent to the projection beam and, in an embodiment, transmits substantially all the radiation of the beam.

Evaporation of the coating 4 is therefore prevented, allowing its thickness to be more accurately controlled. (There will not be a reduction in the thickness of the coating 4 over time because the evaporation prevention layer 5 prevents it evaporating.)

Another liquid supply system which has been proposed is to provide the liquid supply system with a seal member which extends along at least a part of a boundary of the space between the final element of the projection system and the substrate table. The seal member is substantially stationary relative to the projection system in the XY plane though there may be some relative movement in the Z direction (in the direction of the optical axis). A seal is formed between the seal member and the surface of the substrate. In an embodiment, the seal is a contactless seal such as a gas seal. Such a system with a gas seal is disclosed in U.S. patent application Ser. No. 10/705,783, hereby incorporated in its entirety by reference.

Figure 7:
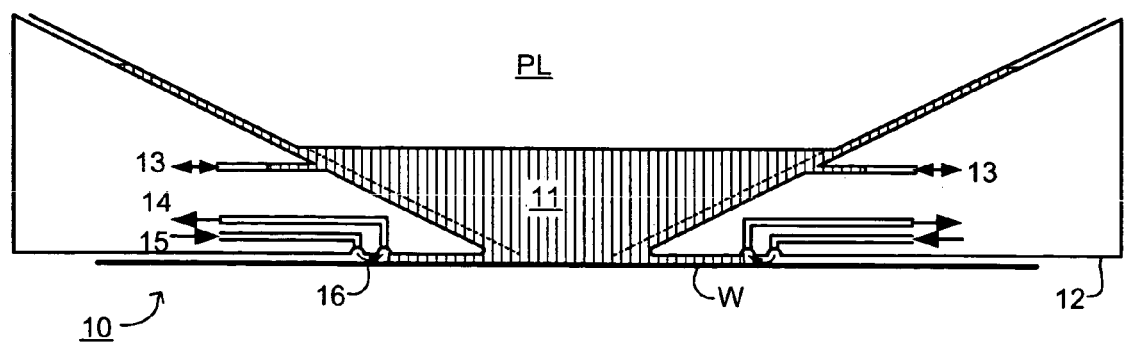
FIG. 7 depicts a liquid supply system of an embodiment of the invention.

FIG. 7 depicts a liquid supply system, or reservoir, to provide liquid to a space between the final element of the projection system PL and the substrate W. Other liquid supply systems, such as those described herein, may be used in this embodiment of the invention.

The reservoir 10 forms a contactless seal to the substrate around the image field of the projection system so that liquid is confined to fill a space between the substrate surface and the final element of the projection system. The reservoir is formed by a seal member 12 positioned below and surrounding the final element of the projection system PL. Liquid is brought into the space below the projection system and within the seal member 12. The seal member 12 extends a little above the final element of the projection system and the liquid level rises above the final element so that a buffer of liquid is provided. The seal member 12 has an inner periphery that at the upper end preferably closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the seal member 12 and the surface of the substrate W. The gas seal is formed by gas, e.g. air or synthetic air but preferably $N_2$ or another inert gas, provided under pressure via inlet 15 to the gap between seal member 12 and substrate and extracted via first outlet 14. The overpressure on the gas inlet 15, vacuum level on the first outlet 14 and geometry of the gap are arranged so that there is a high-velocity gas flow inwards that confines the liquid.

Figure 8:
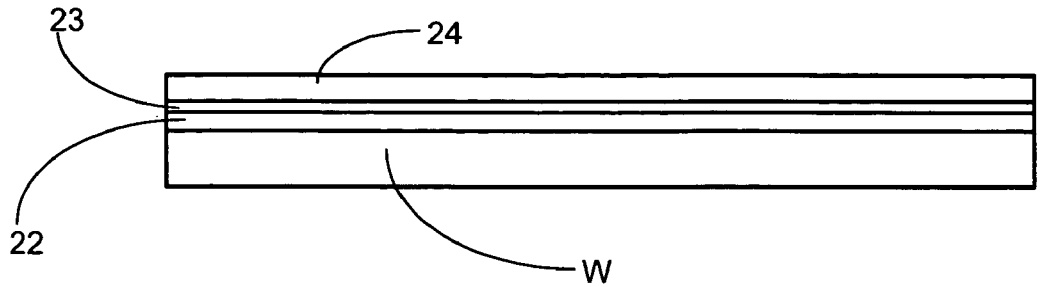
FIG. 8 illustrates a substrate according to an embodiment of the present invention.

FIG. 8 depicts a substrate W according to a third embodiment of the invention ready for processing in a lithographic apparatus. A layer of radiation sensitive material 22 (i.e. the so called "resist") is present on top of a surface of the substrate W. The radiation sensitive material 22 is approximately 200 nm thick. A layer 23 of protective material is present above the radiation sensitive material 22 to protect it from contaminants. This protective material is thin. In an embodiment, the thickness is less than one wavelength of the radiation of the projection beam. For example, the layer 23 of protective material may be approximately 80 nm thick.

A top coating 24 is provided above (e.g., applied to) the layer of protective material 23. The top coating or layer 24 is of a material not sensitive to radiation at the wavelength of the projection beam PB and is at least partially transparent to the radiation of the wavelength of the projection beam PB. In an embodiment, it is different to and immiscible with the immersion liquid. The top coating 24 is, in an embodiment, attached to the substrate W and may be solid. In an embodiment, the top coating 24 transmits at least 80% of the radiation of the projection beam. In an embodiment, the top coating 24 may transmit at least 90% or at least 95% of the radiation of the projection beam. In an embodiment, the top coating 24 is also not reactive with the immersion liquid provided by the liquid supply system such as those illustrated in FIGS. 2 and 3, 4 or 7. At a wavelength of 193 nm, water may be a suitable liquid for use as an immersion liquid.

Figure 9:
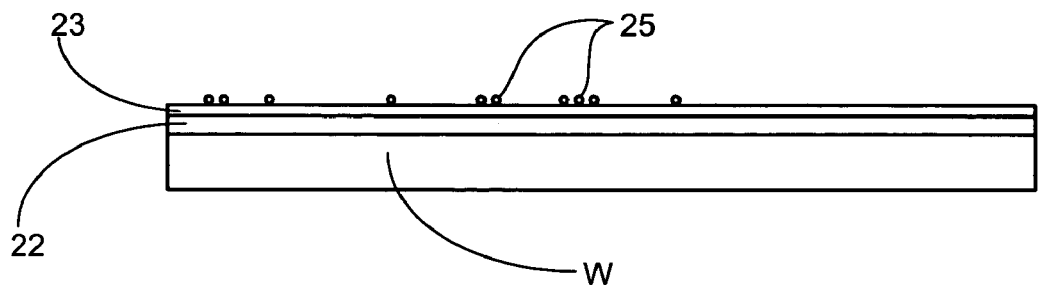
FIGS. 9 and 10 illustrate a conventional substrate and a substrate according to an embodiment of the invention respectively under a projection system during imaging.
Figure 10:
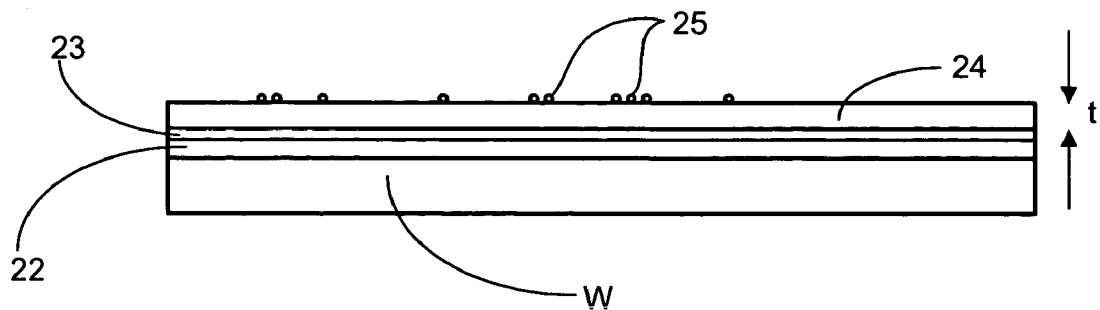

FIGS. 9 and 10 illustrate how an embodiment of the present invention functions. In FIG. 9, the substrate W is a standard substrate covered, at least in part, with immersion liquid during imaging. FIG. 10 illustrates a substrate according to an embodiment of the invention during imaging. As can be seen in FIG. 9, bubbles and/or particles 25 in the immersion liquid in a conventional substrate are only 80 nm away (i.e., the thickness of the protective layer 3) from the radiation sensitive layer 22. In this instance, any bubbles and/or particles on the surface of the substrate can seriously affect the imaging quality, for example, by being within the depth of focus. In contrast, as can seen from FIG. 10, the top coating 24 keeps any bubbles and/or particles in the immersion liquid at least a distance t from the radiation sensitive layer 22. Thus, the effect of the bubbles and/or particles on the imaging quality can be considerably reduced (for example, by having the bubbles and/or particles out of focus) without making the lithographic projection apparatus any more complex. In an embodiment, the top coating 24 is hydrophilic, e.g. with a contact angle in the range of from 50 to 70 degrees, to inhibit bubble forming as well as helping any bubbles that do form out of focus.

In an embodiment, it is desired that the top coating 24 has a refractive index substantially the same as that of the immersion liquid, perhaps within 0.2 or 0.1 of that of the immersion liquid. In this way, optical effects such as those resulting from variations in thickness of the coating 24 can be ignored. Thus, in an embodiment, the top coating 24 has a refractive index greater than that of air, in an embodiment as much as that of the immersion liquid if not more. In an embodiment, the non-radiation sensitive material has a refractive index in the range of 1 to 1.9.

In an embodiment, the top coating 24 is much thicker than the wavelength of the projection beam. A thickness to bubble and/or particle diameter ratio should be as close as possible to or larger than 10 to 1. The maximum expected bubble and/or particle size is 1 μm so for best performance the thickness of the top coating 24 should be at least 10 μm. In an embodiment, the thickness may be at least 20 μm or at least 30 μm and up to 100 μm above which the coating may become harder to provide and cost prohibitive.

In an embodiment, the non-radiation sensitive material is substantially insoluble and unreactive in the immersion liquid. If this is not the case, embodiments of the invention will still work but it may be necessary to take dissolution of the top coating 24 into account during imaging of the substrate. In an embodiment, the top coating 24 can be removed with solvents which are typically used with resist processing.

The top coating 24 may be a layer of water with an anti-evaporation coating or similar to the (conventional) layer 23 of protective material which is a water based gel (conventionally known as a top coat). Polymers or plastics may be suitable.

It will be apparent that the function of the layer 23 of protective material and the top coating 24 can be performed by one and the same layer applied at the same time with the thicknesses and properties as described above (i.e. an embodiment of the invention can be regarded as a 'thick' top coat).

In an embodiment, the top coating is hydrophobic, e.g. having a contact angle in the range of from 90 to 120 degrees, in which case it helps prevent leakage of immersion fluid from the reservoir 10.

Any one or more of the foregoing coatings and/or layers (including the resist, the protective layer, the evaporation prevention layer, etc.) may be applied to the substrate W using a coating system. Any now or hereafter known coater may be suitable for this purpose. Referring to FIG. 1, an example embodiment of a coater 36 is depicted. The coater comprises a spindle 30 that holds the substrate W. A spout 32 provides a coating 34 to the substrate W. The coating 34 may comprise any one or more of the foregoing coatings and/or layers. The spindle 30 rotates around an axis perpendicular to the primary surface of the substrate W so that the coating 34 can be evenly spread over the rotating substrate W by centrifugal force. The coater 36 may be a coater already provided in or specially added to a track, may be a coater provided in a substrate handler associated with a lithographic projection apparatus, and/or may be a coater separately provided to apply the coatings and/or layers discussed herein. The coater 36 may be controlled by appropriate software to provide the relevant thickness(es) of the coating(s)/layer(s).

Figure 4:
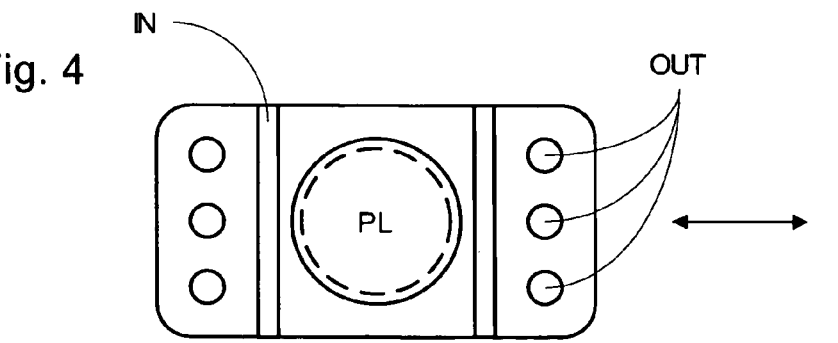
FIG. 4 depicts another liquid supply system for use with an embodiment of the invention.
Figure 4:
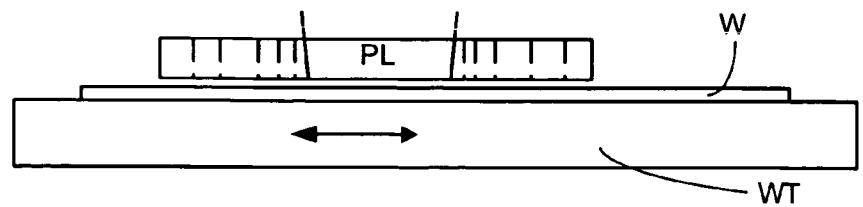

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Other types of liquid supply systems are clearly possible including those with different arrangements of inlets and outlets and also those which are asymmetric.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the present invention can be applied to any immersion lithography apparatus, in particular, but not exclusively, those types mentioned above. Thus, the descriptions above are intended to be illustrative, not limiting. It will be apparent to one skilled in the art that modifications may be made to the invention as described without departing from the scope of the claims set out below.

The invention claimed is:

1. A lithographic apparatus, comprising:
    a lithographic projection apparatus arranged to transfer a pattern to a radiation-sensitive layer of a substrate using a beam of radiation having an exposure wavelength;
    a coater arranged to at least partially coat the substrate with a layer of non-radiation-sensitive coating material which is at least partially transparent to radiation of the exposure wavelength, wherein the layer of non-radiation-sensitive coating material is positioned before the layer of radiation-sensitive material in the path of the beam of radiation, and wherein, in use, the coater applies the layer of non-radiation-sensitive coating material to a thickness which is greater than the exposure wavelength; and
    a liquid supply system configured to provide a liquid to a space between a projection system of the lithographic projection apparatus and the non-radiation sensitive layer of the substrate to be in contact with the non-radiation sensitive layer.

2. The apparatus of claim 1, wherein the coater is further arranged to at least partially coat the substrate with a protective material to protect the layer of radiation-sensitive material prior to coating the substrate with the non-radiation-sensitive coating material.

3. The apparatus of claim 2, wherein the protective material is or becomes substantially solid.

4. The apparatus of claim 1, wherein the coater is further arranged to at least partially cover the non-radiation-sensitive coating material with an evaporation prevention material configured to prevent the non-radiation-sensitive coating material from evaporating.

5. The apparatus of claim 1, wherein the coating material has a refractive index in the range of from 1.0 to 1.9.

6. The apparatus of claim 5, wherein the coating material is substantially water.

7. The apparatus of claim 1, wherein the thickness is at least 5 μm.

8. The apparatus of claim 1, wherein the non-radiation sensitive material has a first refractive index, the liquid has a second refractive index, and the first refractive index is within 0.2 of the second refractive index.

9. The apparatus of claim 1, wherein the non-radiation sensitive material is substantially insoluble in and unreactive with the liquid.

10. The apparatus of claim 1, wherein the coater is configured to coat the non-radiation sensitive material to a thickness effective to substantially reduce the effect of bubbles in the liquid, of particles in the liquid, or both, on the quality of the patterned beam impinging on the radiation sensitive layer.

11. The apparatus of claim 1, wherein the non-radiation sensitive material is a material different than that of the liquid.

12. The apparatus of claim 1, wherein the layer of non-radiation sensitive material is or becomes a substantially solid or gel.

13. A lithographic apparatus, comprising:
    a lithographic projection apparatus arranged to transfer a pattern to a radiation-sensitive layer of a substrate using a beam of radiation and configured to provide a liquid to a space between a projection system of the lithographic projection apparatus and a layer of non-radiation sensitive coating material of the substrate to be in contact with the layer of non-radiation sensitive coating material; and
    a coater arranged to at least partially coat the substrate with the layer of non-radiation-sensitive coating material which is at least partially transparent to radiation of the exposure wavelength, wherein the layer of non-radiation-sensitive coating material is positioned before the layer of radiation-sensitive material in the path of the beam of radiation, and wherein, in use, the coater applies the layer of non-radiation sensitive material to a thickness effective to substantially reduce the effect of bubbles in the liquid, of particles in the liquid, or both, on the quality of the beam impinging on the radiation sensitive layer.

14. The apparatus of claim 13, wherein the coater is further arranged to at least partially coat the substrate with a protective material to protect the layer of radiation-sensitive material prior to coating the substrate with the non-radiation-sensitive coating material.

15. The apparatus of claim 13, wherein the coater is further arranged to at least partially cover the non-radiation-sensitive coating material with an evaporation prevention material configured to prevent the non-radiation-sensitive coating material from evaporating.

16. The apparatus of claim 13, wherein the coating material is substantially water.

17. A lithographic apparatus, comprising:
    a lithographic projection apparatus arranged to transfer a pattern to a radiation-sensitive layer of a substrate using a beam of radiation having an exposure wavelength; and
    a coater arranged to at least partially coat the substrate with a layer of non-radiation-sensitive coating material which is at least partially transparent to radiation of the exposure wavelength, wherein the layer of non-radiation-sensitive coating material is positioned before the layer of radiation-sensitive material in the path of the beam of radiation, and wherein, in use, the coater applies the layer of non-radiation-sensitive coating material to a thickness which is greater than the exposure wavelength before the substrate is moved to the pattern transfer location and the layer of non-radiation-sensitive coating material has a free top surface during such movement.

18. The apparatus of claim 17, wherein the layer of non-radiation sensitive material is or becomes a substantially solid or gel.

19. The apparatus of claim 17, wherein the coater is further arranged to at least partially cover the non-radiation-sensitive coating material with an evaporation prevention material configured to prevent the non-radiation-sensitive coating material from evaporating.

20. A substrate for use in a lithographic projection apparatus, the substrate being at least partly covered by a radiation sensitive layer, the radiation sensitive layer being at least partly covered with non-radiation sensitive material which is at least partly transparent to said radiation and being of a different material than an immersion liquid through which a patterned beam of said radiation of the lithographic projection apparatus is projected onto a target portion of said substrate, wherein the non-radiation sensitive material has a thickness and the radiation has a wavelength and the thickness is greater than said wavelength.

21. The substrate of claim 20, wherein said non-radiation sensitive material has a thickness of at least 5 μm.

22. The substrate of claim 21, wherein said non-radiation sensitive material has a thickness of one of at least 10 μm and at least 20 μm.

23. The substrate of claim 20, wherein said non-radiation sensitive material has a first refractive index and said immersion liquid has a second refractive index, and said first refractive index is within 0.2 of said second refractive index.

24. The substrate of claim 23, wherein said first refractive index is one of within 0.1 of and substantially the same as said second refractive index.

25. The substrate of claim 20, wherein said non-radiation sensitive material has a refractive index in the range of 1.0 to 1.7.

26. The substrate of claim 20, wherein a further protective material is present between said radiation sensitive layer and said non-radiation sensitive layer.

27. The substrate of claim 20, wherein said non-radiation sensitive material is substantially insoluble in and unreactive with said immersion liquid.

28. The substrate of claim 20, wherein the non-radiation sensitive layer is of a thickness effective to substantially reduce the effect of at least one of bubbles and particles in said immersion liquid on the quality of a patterned beam impinging on the radiation sensitive layer.

* * * * *